United States Patent
Ovsyannikov et al.

(10) Patent No.: US 10,297,413 B2
(45) Date of Patent: May 21, 2019

(54) METHOD AND DEVICE FOR THE PRODUCTION OF HIGHLY CHARGED IONS

(71) Applicants: Vladimir Petrovich Ovsyannikov, Dresden (DE); Andrei Vladimirovich Nefiodov, Gatchina Leningrad district (RU); Oleg Kostantinovich Kultashev, Fryazino Moscow district (RU)

(72) Inventors: Vladimir Petrovich Ovsyannikov, Dresden (DE); Andrei Vladimirovich Nefiodov, Gatchina Leningrad district (RU); Oleg Kostantinovich Kultashev, Fryazino Moscow district (RU)

(73) Assignee: North-Western International Cleaner Production Centre, St. Petersburg (RU)

( * ) Notice: Subject to any disclaimer, the term of this patent is extended or adjusted under 35 U.S.C. 154(b) by 0 days.

(21) Appl. No.: 15/556,541

(22) PCT Filed: Mar. 10, 2016

(86) PCT No.: PCT/EP2016/055168
§ 371 (c)(1),
(2) Date: Sep. 7, 2017

(87) PCT Pub. No.: WO2016/142481
PCT Pub. Date: Sep. 15, 2016

(65) Prior Publication Data
US 2018/0040450 A1    Feb. 8, 2018

Related U.S. Application Data

(60) Provisional application No. 62/130,935, filed on Mar. 10, 2015.

(51) Int. Cl.
*H01J 27/18* (2006.01)
*H01J 37/08* (2006.01)
(Continued)

(52) U.S. Cl.
CPC .......... *H01J 27/18* (2013.01); *H01J 27/205* (2013.01); *H01J 37/08* (2013.01); *H01J 49/147* (2013.01); *H01J 2237/082* (2013.01)

(58) Field of Classification Search
CPC .. H01J 37/05; H01J 37/26; H01J 37/28; H01J 37/244; H01J 37/263
(Continued)

(56) References Cited

U.S. PATENT DOCUMENTS

| 5,736,742 A * | 4/1998 | Ochiai | H01J 37/10 250/396 R |
| 6,707,240 B1 * | 3/2004 | Nakasuji | H01J 3/024 313/341 |

(Continued)

OTHER PUBLICATIONS

Ovsyannikov, "Main Magnetic Focus ion Trap, new tool for trapping of highly charged ions,": XP055270929: https://arxiv.org/ftp/arxiv/papers/1403/1403.2168.pdf: Mar. 10, 2014.

(Continued)

*Primary Examiner* — Tung X Le
(74) *Attorney, Agent, or Firm* — Davidson, Davidson & Kappel, LLC

(57) ABSTRACT

The invention relates to a novel ion source, which uses method for the production of highly charged ions in the local ion traps created by an axially symmetric electron beam in the thick magnetic lens. The highly charged ions are produced in the separate local ion traps, which are created as a sequence of the focuses ($F_1$, $F_2$, and $F_3$) of the electron beam (EB) rippled in the magnetic field (B(z)). Since the most acute focus is called the main one, the ion source is classified as main magnetic focus ion source (MaMFIS/T), which can also operate in the trapping regime. The electron current density in the local ion traps can be much greater than that in the case of Brillouin flow. For the ion trap with length of about 1 mm, the average electron current density of up to the (Continued)

Figure 1:
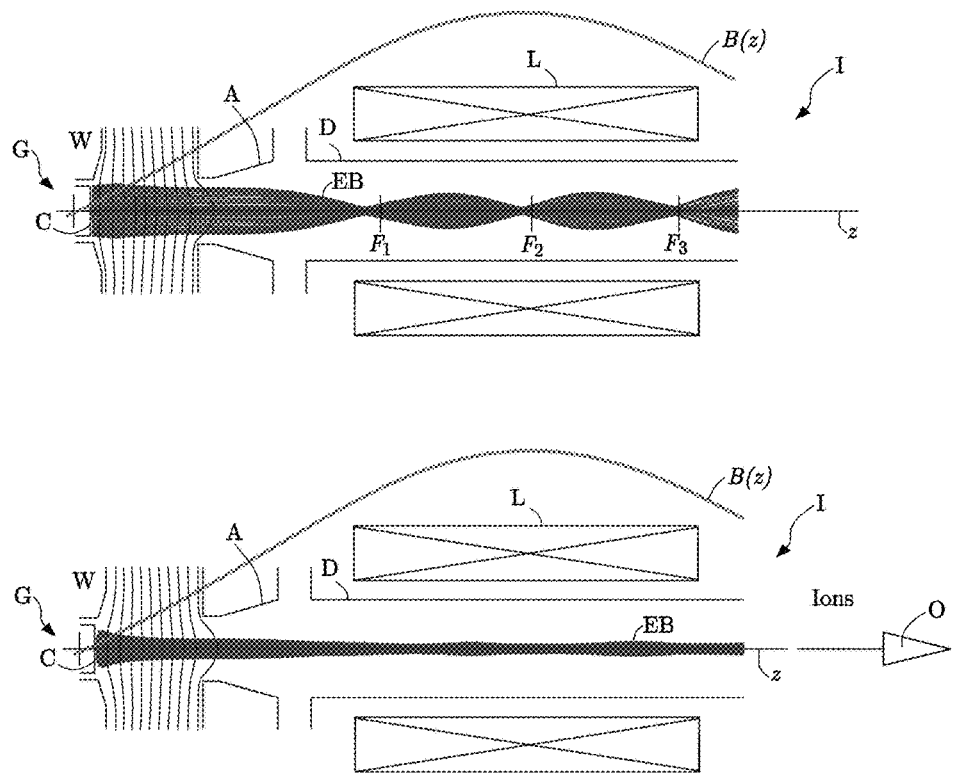

order of 100 kA/cm$^2$ can be achieved. Thus it allows one to produce ions in any charge state for all elements of the Periodic Table. In order to extract the ions, geometry of the electron beam is changed to a relatively smooth electron beam by setting the potential of the focusing electrode (W) of the electron gun negative with respect to the potential of the cathode (C).

10 Claims, 10 Drawing Sheets

(51) Int. Cl.
*H01J 49/14* (2006.01)
*H01J 27/20* (2006.01)

(58) Field of Classification Search
USPC ..................................... 250/310, 396 R, 397
See application file for complete search history.

(56) References Cited

U.S. PATENT DOCUMENTS

| | | | |
|---|---|---|---|
| 6,717,155 B1 | 4/2004 | Zschornack et al. | |
| 2002/0096632 A1* | 7/2002 | Kaji | G01N 23/2251 250/305 |
| 2008/0087842 A1 | 4/2008 | Sakurai et al. | |
| 2012/0241611 A1* | 9/2012 | Kaji | H01J 37/244 250/311 |
| 2013/0038200 A1 | 2/2013 | True | |
| 2013/0087703 A1* | 4/2013 | Onishi | H01J 37/065 250/306 |
| 2015/0014531 A1* | 1/2015 | Yamazaki | H01J 37/244 250/311 |
| 2015/0034824 A1* | 2/2015 | Mori | H01J 37/05 250/310 |
| 2015/0102221 A1* | 4/2015 | Sasaki | H01J 37/05 250/310 |

OTHER PUBLICATIONS

Beebe et al, "An Electron Beam Ion Source for Laboratory Experiments," Review of Scientific Instruments, AIP, vol. 63; No. 6; Jun. 1, 1992: pp. 3399-3411.

Ovsyannikov et al, "Main Magnetic Focus Ion Source: I. Basic principles and theoretical predictions,": XP055270927: http://arxiv.org/pdf/1503.05169.pdf: Mar. 17, 2015.

Ovsyannikov et al., "Main magnetic focus ion source: Basic principles, theoretical predictions and experimental confirmations,": Nuclear Instruments & Methods in Physics Research. Section B: Beam Interactions with Materials and Atoms; vol. 370; Jan. 12, 2016.

Ovsyannikov et al., "Universal main magnetic focus ion source: A new tool for laboratory research of astrophysics and Tokamak microplasma,"; International Conference on Particle Physics and Astrophysics; IOP Conf. Series: Journal of Physics: Conf. Series 798; 2017.

Ovsyannikov et al., "Universal main magnetic focus ion source for production of highly charged ions,": Elsevier B.V.; Nuclear Instruments and Methods in Physics Research B; May 10, 2017.

E. D. Donets, USSR Inventor's Certificate No. 248860, Mar. 16, 1967; Bull. OIPOTZ 23, 65 (1969).

Amboss, "Studies of a Magnetically Compressed Electron Beam,"; *IEEE Transactions on Electron Devices*; vol. ED-16; No. 11; Nov. 1969.

M. Kleinod, R. Becker, O. Kester, A. Lakatos, H. Thomae, B. Zipfel, and H. Klein, Frankfurt EBIS development: fundamental research and new applications, Rev. Sci. Instrum. 65, 1069 (1994).

International Search Report in corresponding International Application No. PCT/EP2016/055168 dated May 20, 2016.

\* cited by examiner

METHOD AND DEVICE FOR THE PRODUCTION OF HIGHLY CHARGED IONS

This application is a U.S. national phase application under 35 U.S.C. of § 371 of International Application No. PCT/EP2016/055168, filed Mar. 10, 2016, which claims priority to U.S. Provisional Application No. 62/130,935, filed Mar. 10, 2015, the disclosures of which is hereby incorporated by reference herein.

FIELD OF THE INVENTION

The invention is related to the plasma and atomic physics, in particular, to the x-ray spectroscopy. The ion source can also be applied to research of the solid-state surface.

BACKGROUND

It is known from E. D. Donets, USSR Inventor's Certificate No. 248860, Mar. 16, 1967; Bull. OIPOTZ 23, 65 (1969) that there is the electron-beam method for the production of highly charged ions in the trap formed by the electron beam of a constant radius propagating inside the drift tube, which consists of, at least, three sections with positive potentials applied at the edge sections with respect to the middle one. The control of axial movement of ions (injection, trapping and extraction of ions from the trap) is carried out by variation of the potential distribution on sections of the drift tube.

The axially symmetric magnetic field is used for focusing the electrons emitted from cathode of the electron gun into the electron beam of consistent diameter and of relatively large length. In this case, the current density of the electron beam, which determines the maximum achievable ion charge and the average ion beam current, cannot exceed of the so-called Brillouin electron current density. In real running electron beam ion sources, the current density turns out to be less than Brillouin limit by many times.

It is also known from M. Kleinod, R. Becker, O. Kester, A. Lakatos, H. Thomaae, B. Zipfel, and H. Klein, Frankfurt EBIS development: fundamental research and new applications, Rev. Sci. Instrum. 65, 1069 (1994) that there is the method for the production of highly charged ions in crossover of the electron beam, which is focused by the system of electrostatic lenses. The drawbacks of this method are the aberrations of lenses and the need of high voltages, which result in relatively low current density.

It is well known that the electron beam, which is formed in electron gun with cathode placed in the zero magnetic field, is transformed into the sequence of optical focuses in the axially symmetric magnetic field of sufficient length (thick magnetic lens). Theoretically, the first (main) focus is the most acute. In the main magnetic focus, the electron beam reaches the current density, which is considerably greater than that in the case of the Brillouin flow.

In subsequent optical focuses, the current density of electrons drops with length of the beam due to influence of the thermal velocities of electrons and effects of aberrations of the electrostatic (anode of the electron gun) and magnetic (focusing magnetic field) lenses. This is described in K. Amboss, Studies of a Magnetically Compressed Electron Beam, IEEE Trans. Electr. Devices 16, 897 (1969).

BRIEF DESCRIPTION OF THE INVENTION

The electron beam of variable radius, which propagates in the drift tube of constant radius, creates a sequence of local ion traps, the positions of which coincide with the positions of maximum value of the electron current density. The highly charged ions are prepared in local ion traps with extremely high current density. Thus it becomes possible to create the ion trap with the electron current density, which is significantly greater than that of the Brillouin flow. For this purpose, any one of the first three magnetic optical focuses can be used in practice.

The electron beam may be created by the electron gun with a cathode, a focusing electrode, and an anode and the cathode is located in the magnetic field characterized by the strength in the range from 0 to 200 Gauss.

The potential distribution along the axis of the ion source is determined by the geometry of both the electron beam and the drift tube. In order to extract the ions out of the trap, one can change the geometry of the electron beam. Namely, one can transform the electron beam with variable radius into the beam with constant radius. Such transformation of the electron beam becomes possible for special distribution of magnetic field by applying of negative potential on the focusing electrode of the electron gun, relatively to the cathode of the electron gun (see FIGS. 1 and 2). For better extraction and for opportunities to work in the leaky mode, it is possible to design the anode with expansion into the side of ion output. In this case, the potential distribution along the axis of the ion source in the direction of ion extraction has a smooth gradient (see FIGS. 3 and 4). For adjustable control of ion extraction the extractor electrode with a negative voltage can be installed behind the anode (see FIG. 5).

DETAILED DESCRIPTION OF THE DRAWINGS

Figure 2:
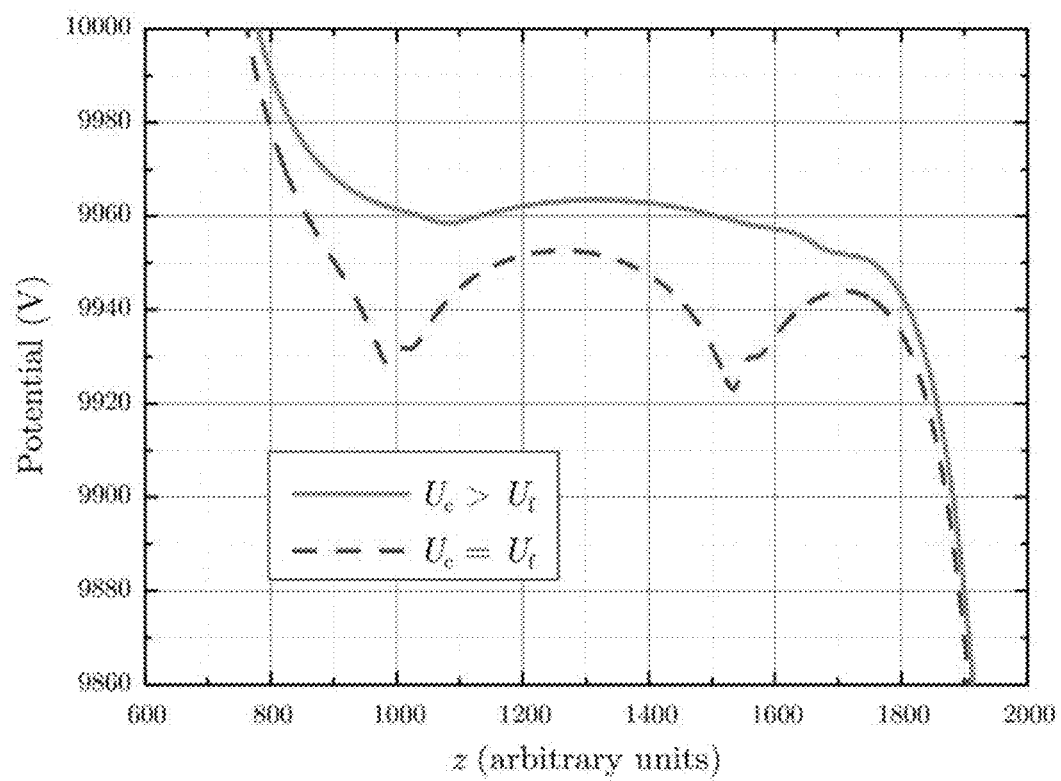
Figure 3:
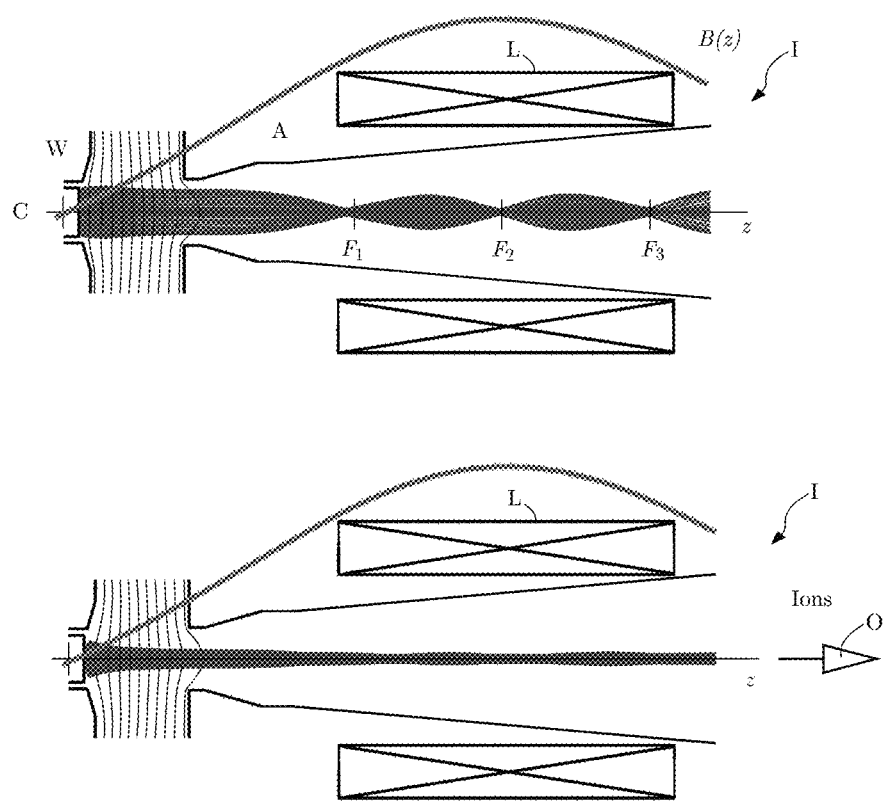
Figure 4:
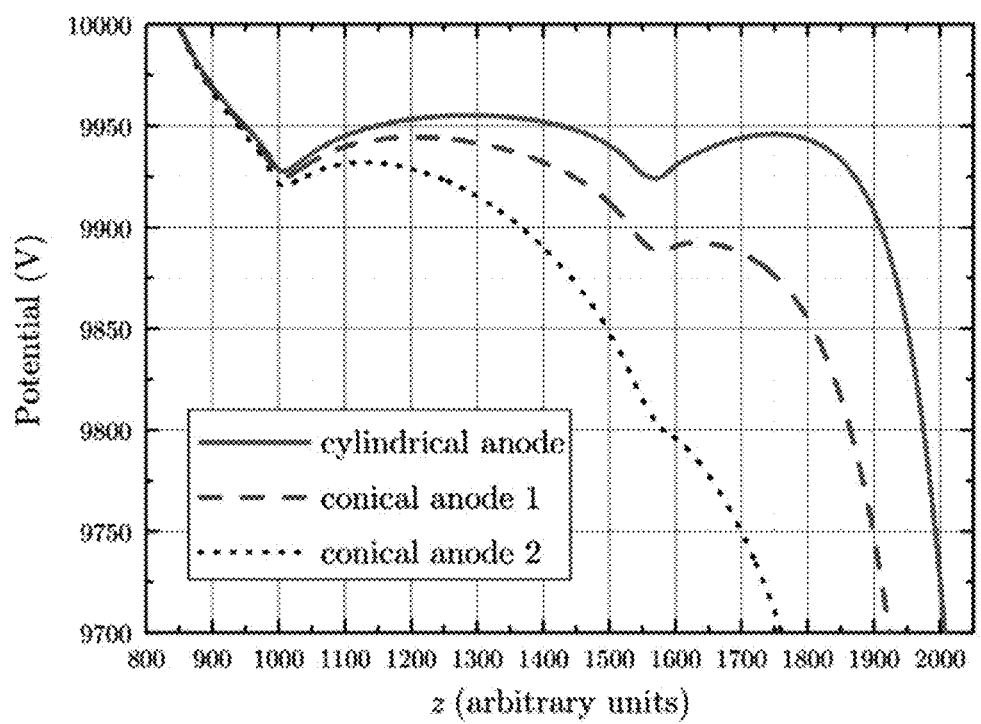
Figure 5:
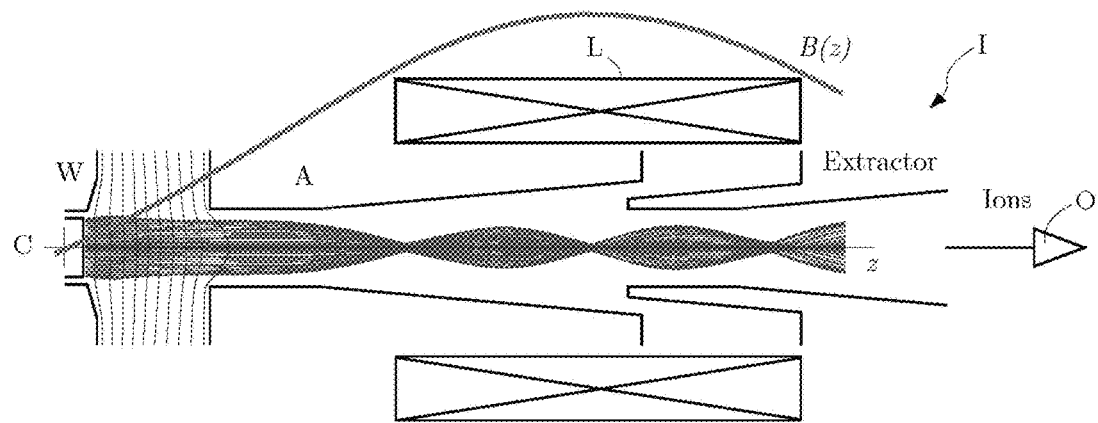

The method of the invention is explained in more details by examples below. The accompanying pictures are given as follows:

FIG. 1. Basic scheme of the invention with the anode and the drift tube of constant diameter;

FIG. 2. Potential distribution along the z axis for the case depicted in FIG. 1;

FIG. 3. Basic scheme of the invention with the anode of conical form;

FIG. 4. Potential distribution along the z axis for the case depicted in FIG. 3;

FIG. 5. Basic scheme of the invention with the anode of conical form and additional extractor placed directly behind the anode.

Figure 6:
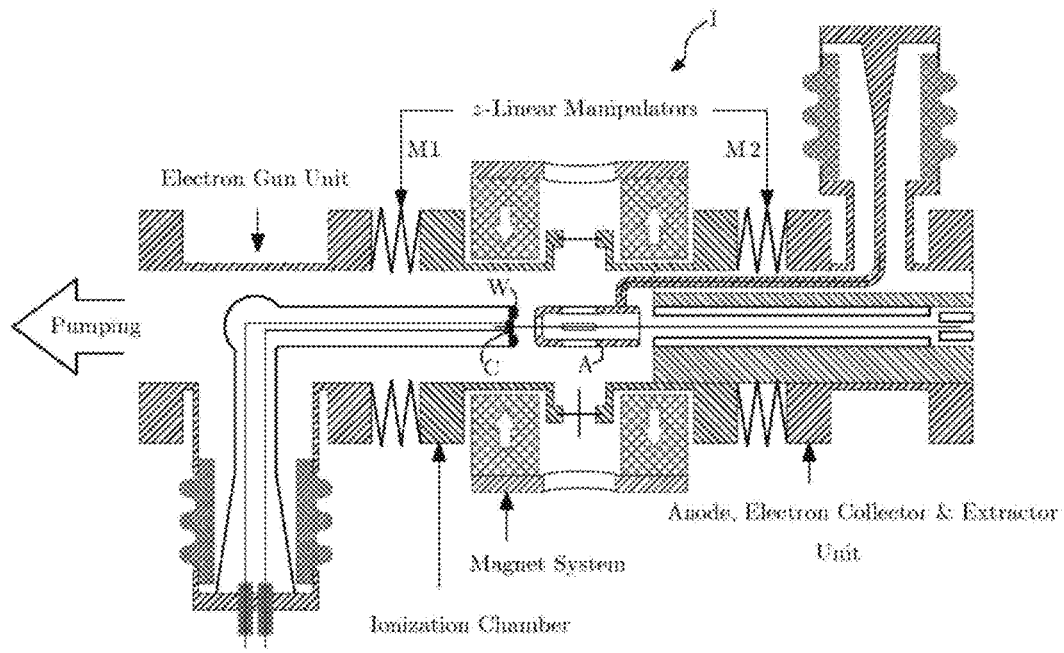
Figure 7:
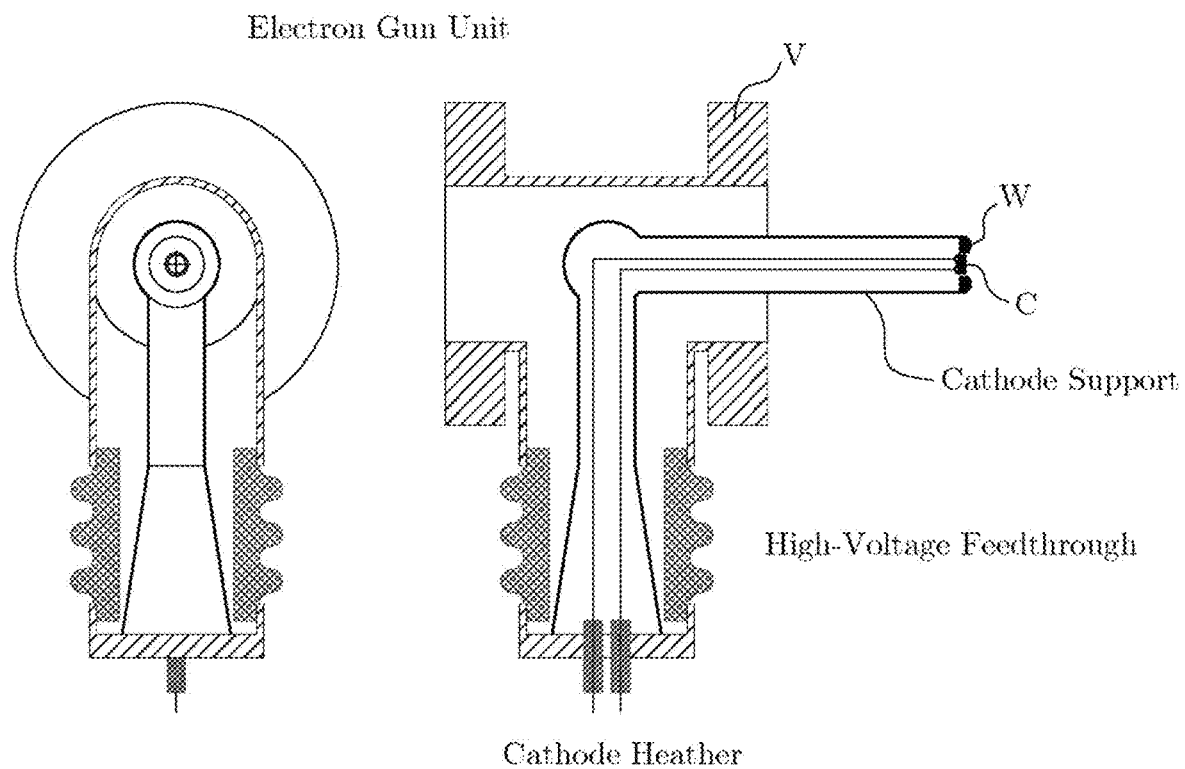
Figure 8:
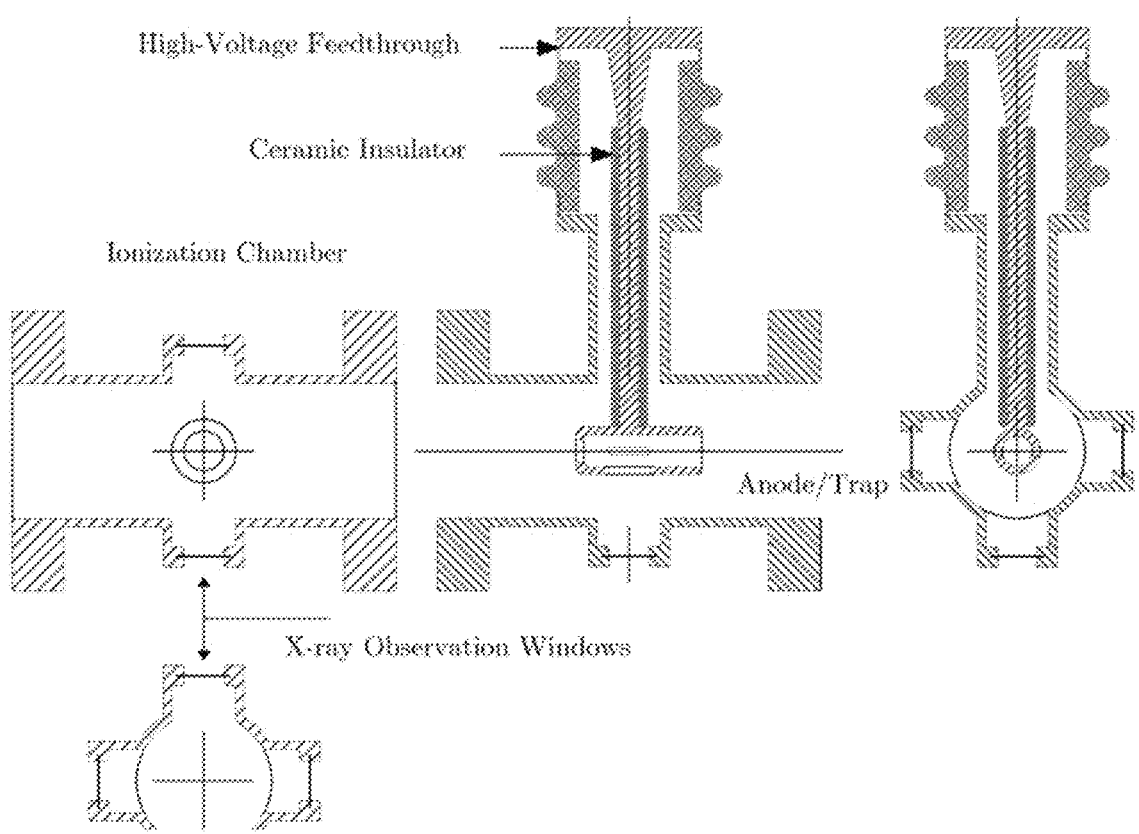
Figure 10:
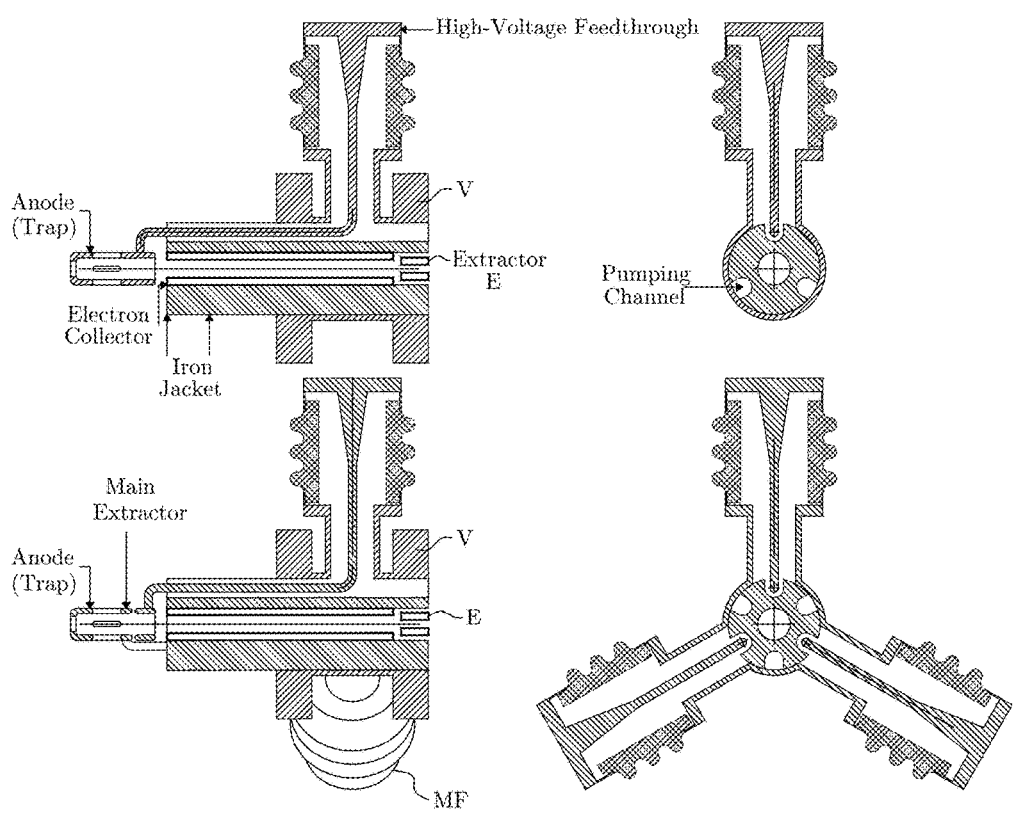
Figure 11:
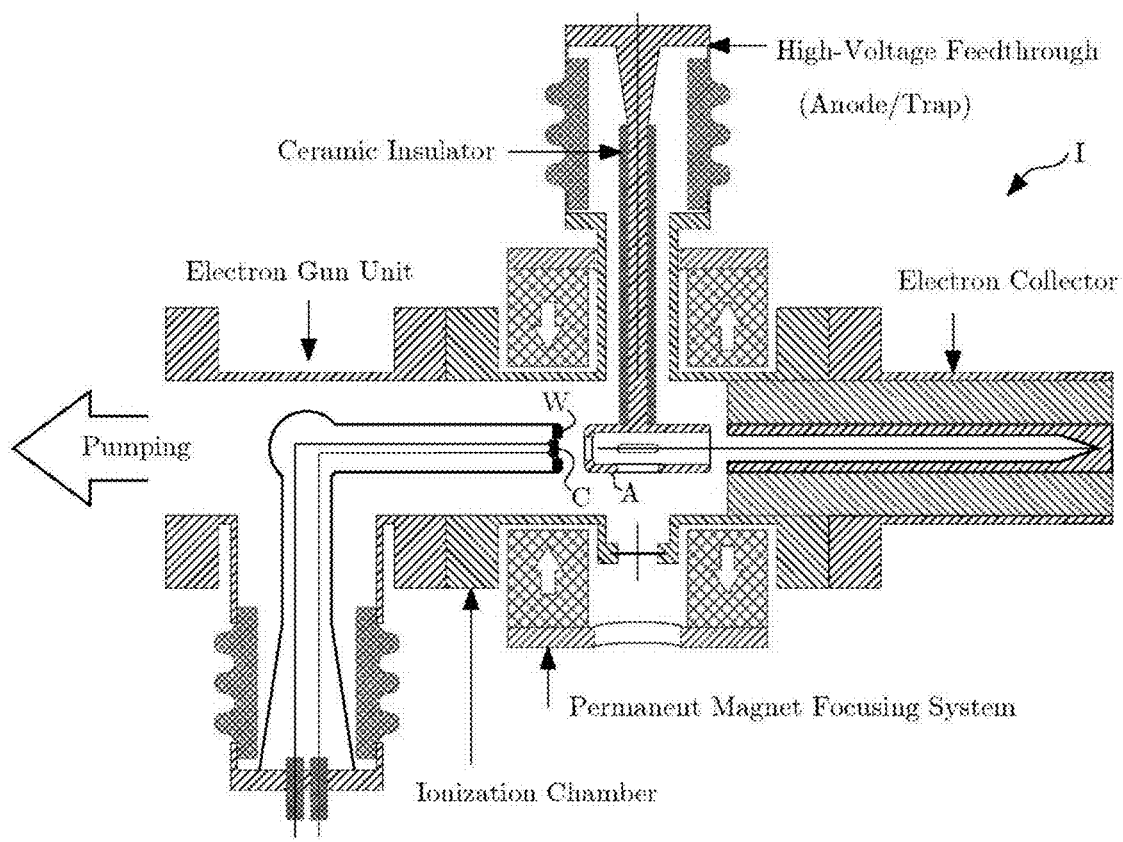

FIG. 6. Schematic representation of the basic design of MaMFIS/T;

FIG. 7. Schematic representation of the electron gun unit;

FIG. 8. Schematic representation of the ionization chamber;

FIG. 9. Schematic representation of the permanent magnet focusing system;

FIG. 10. Schematic representation for the assembly of anode, electron collector, and ion extractor;

FIG. 11. Schematic representation of the invention design.

The method of invention is schematically illustrated in FIG. 1. The electron gun G with the cathode C and the focusing (Wehnelt) electrode W, anode A, and drift tube D of constant diameter are installed on the z axis of ion source I. The distribution of the magnetic field B(z) along the z axis is chosen, so that the electron beam EB creates three optical focuses denoted by F1, F2, and F3, respectively. In this case, the potential Uc of cathode C is equal to the potential Uf of the focusing electrode W, (Uc=Uf). The potential distribution along the axis z of the ion source I is shown in FIG. 2. Obviously, the electron beam EB creates three local ion traps, in which the ions are confined. The confined ions are exposed to the additional ionization in the dense electron beam EB during the time, when this potential distribution exists (FIG. 2, broken line). The distribution of the magnetic field B(z) satisfies to the condition, that the electron beam EB becomes relatively smooth, if the potential of the focusing electrode W becomes negative with respect to the potential of the cathode C, (Uc>Uf). In this case, the potential distribution on the z axis does not create the local ion traps (FIG. 2, continuous line). Accordingly, the highly charged ions can leave the trap.

The invention with the conical anode A is shown in FIG. 3. The electron gun G with the cathode C and the focusing (Wehnelt) electrode W and the anode A with conical expansion in the direction of ion output O are installed on the z axis of ion source. The potential distribution for this geometry is shown in FIG. 4. This potential distribution has a general slope in the direction of ion output O. Therefore, the highly charged ions, which are being prepared in the process of ionization at a certain temperature, can always leave the local traps (see FIG. 4, broken and dotted lines). For comparison, the potential distribution corresponding to the cylindrical anode A is also depicted in FIG. 4 (see continuous line). The larger is the angular expansion of conical tube, the steeper is the slope of the corresponding potential distribution. In particular, the angular expansion of the anode A shown as conical anode 2 is larger than that of the anode A shown as conical anode 1 (compare dotted and broken lines in FIG. 4). Thus the leaky mode for the direct ion current can be implemented. In order to improve the quality of ion extraction, the special extractor electrode E can be installed behind the conical anode A (see FIG. 5).

In the following a device according to the invention will be described as shown in FIGS. 6 to 11.

The ion source I (FIG. 6) consists of three parts, namely, the electron gun unit (FIG. 7), the ionization chamber (FIG. 8) with magnetic focusing system (FIG. 9), and the unit of electron collector together with the ion trap and ion optics (FIG. 10). These three parts are combined together via the z-axis linear manipulators between them.

The base of design of the complete installation is the ionization chamber with magnetic focusing system.

All other parts of the ion source I are built up regarding the line of this unit. The first z-linear manipulator M1 changes the position of the cathode C in the magnetic field (see FIG. 6). The second manipulator M2 changes the cathode-anode distance. These routines allow one to manipulate and change the characteristics of the electron beam, such as the intercepted current, the maximum current density, the perveance, and the spatial position of the local ion traps. The ionization chamber (FIG. 8) has a number of ports for installation of the observation windows in the middle plane. One of the ports can be equipped with a high-voltage feedthrough for anode/trap.

Figure 9A:
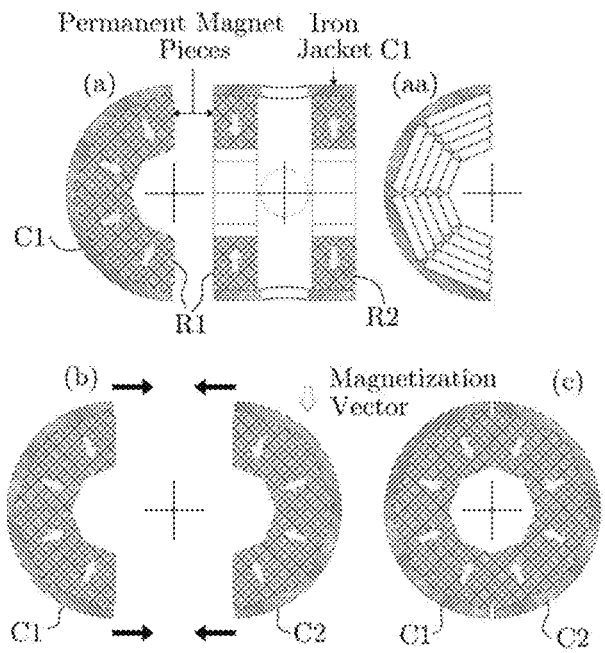
Figure 9B:
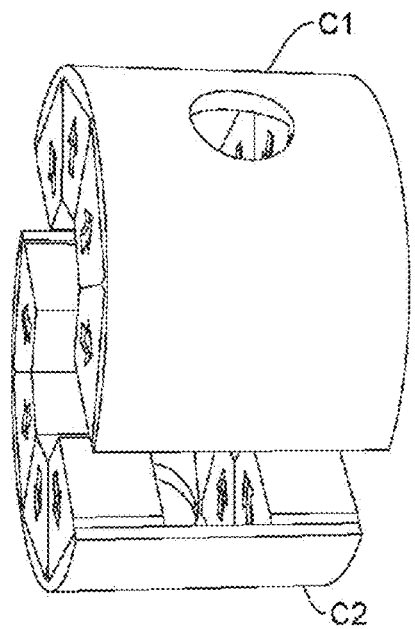

The magnetic focusing system can be constructed either as an electromagnet (including superconducting magnet) or on the basis of radial permanent magnets. The focusing system (FIG. 9) is combined from the trapezoidal pieces of permanent magnets with the radial magnetization vector. Each individual trapezoidal part can be made of rectangular magnetic pieces (FIG. 9aa). These constituent elements are collected in two half rings R1 and R2, which are combined together by the half-cylinder made of a soft iron (FIG. 9a). The two half-cylinders C1 and C2 are installed on the body of ionization chamber by pressing on them in the radial direction (FIG. 9b). Finally, the complete magnet provides the axially symmetric focusing magnetic field in the space in between the magnetic coils (FIG. 9c).

The electron gun is installed in the cylindrical vacuum chamber V (see FIG. 7). The power is supplied with the use of the radial high-voltage feedthroughs. Design of this unit allows one to pump out the source along the axis through the electron gun chamber, which is transparent for the vacuum pumping. The cathode and the heather strips are insulated from the Wehnelt electrode W.

The anode A, electron collector, and extractor E are located in cylindrical vacuum chamber V (see FIG. 10). In the case of running mode with one anode, the radial high-voltage feedthroughs (at least one) are used. In the running mode with the conical anode and the extractor electrode behind it, two or more high-voltage feedthroughs are required. The electron collector is surrounded by a magnetically soft iron for cutting the magnetic field on the axis within the range of the electron collector. The iron magnetic shield has the axially symmetric canals for the electrical connectors and vacuum pumping. The whole assembly, which consists of anode A, electron collector with iron shield, and extractor E, can be shifted along the z axis. The simplified invention design is shown in FIG. 11. For given electron energy and current density the position of cathode is fixed in the magnetic field MF. In this case, all parts of the ion source I are also fixed together, without using the z-linear manipulators.

LIST OF REFERENCE SYMBOLS

A anode
B(z) magnetic field distribution of thick magnetic lens
C cathode
D drift tube
E extractor electrode
EB electron beam
F1, F2, F3 optical focus, position of a local ion trap (electron beam crossover)
G electron gun
I ion source
M1, M2 manipulator
MF magnetic field
O ion output
R1, R2 half ring
Uc potential of cathode
Uf potential of focusing electrode
V vacuum chamber
W focusing (Wehnelt) electrode
z axis along the electron beam
C1, C2 half cylinder
L thick magnetic lens

The invention claimed is:

1. A method for a production of highly charged ions in local ion traps by generating an electron beam with a variable radius propagating through a drift tube in a longitudinal magnetic field, wherein both the geometry of electron gun and the distribution of magnetic field of a single thick magnetic lens with the field strength of from 0 to 200 Gauss at cathode for focusing the electron beam are determined, so that the electron beam is focused in any one of a first three magnetic optical focuses or in a sequence of three sharpest optical focuses in the trapping mode and the distribution of magnetic field is determined, so that the electron beam is transformed into the beam without ripples in an extraction mode, if potential of a focusing Wehnelt electrode becomes negative with respect to the potential of a cathode.

2. The method according to claim 1, wherein the extraction mode comprises extracting highly charged ions in the axial direction of the cylindrical drift tube, when a negative voltage is applied to the focusing electrode, so that the electron beam is smoothed.

3. The method according to claim 1, wherein the extraction mode comprises extracting highly charged ions in the axial direction of the conical drift tube, whose angle of the cone expansion defines slope of the extraction potential.

4. A device for a production of highly charged ions, consisting of three parts, an electron gun unit, an ionization chamber with a focusing magnet system, and an unit of electron collector with anode and ion optics, such that the parts are connected therebetween either via two z-axis linear manipulators or are fixed together, without using the z-line manipulators, wherein a first z-axis manipulator is installed between the electron gun unit and the ionization chamber and designed to change the position of the electron gun in the magnetic field and the cathode-anode distance of the electron gun and wherein a second z-axis manipulator is installed between the ionization chamber and an assembly of an anode, an electron collector, and an extractor and designed to change the gap between the anode and the cathode of the electron gun in the case of fixed position of the cathode in magnetic field.

5. The device according to claim 4, wherein the electron gun unit is designed to pump out the entire source in the axial direction and wherein a cathode of the electron gun is insulated from a focusing Wehnelt electrode in order to control the behavior of the electron beam.

6. The device according to claim 5, wherein the ionization chamber is provided with a number of observation ports in a middle plane perpendicular to the z-axis and at least some of these ports are occupied by high-voltage feedthroughs with ceramic insulation.

7. The device according to claim 5, wherein the anode, the electron collector and the extractor are mounted into a separate unit with at least one high-voltage feedthrough, wherein a cylindrical iron shield with longitudinal channels for high-voltage feedthroughs and additional pumping surrounds a water-cooled electron collector.

8. The device according to claim 4, wherein the ionization chamber is provided with a number of observation ports in a middle plane perpendicular to the z-axis and at least some of these ports are occupied by high-voltage feedthroughs with ceramic insulation.

9. The device according to claim 8, wherein the anode, the electron collector and the extractor are mounted into a separate unit with at least one high-voltage feedthrough, wherein a cylindrical iron shield with longitudinal channels for high-voltage feedthroughs and additional pumping surrounds a water-cooled electron collector.

10. The device according to claim 4, wherein the anode, the electron collector and the extractor are mounted into a separate unit with at least one high-voltage feedthrough, wherein a cylindrical iron shield with longitudinal channels for high-voltage feedthroughs and additional pumping surrounds a water-cooled electron collector.

* * * * *